(12) United States Patent
Metzger

(10) Patent No.: US 7,868,448 B2
(45) Date of Patent: Jan. 11, 2011

(54) ELECTRICAL COMPONENT AND PRODUCTION THEREOF

(75) Inventor: Thomas Metzger, München (DE)

(73) Assignee: EPCOS AG (DE)

( * ) Notice: Subject to any disclaimer, the term of this patent is extended or adjusted under 35 U.S.C. 154(b) by 396 days.

(21) Appl. No.: 11/497,592

(22) Filed: Aug. 2, 2006

(65) Prior Publication Data
US 2006/0267178 A1    Nov. 30, 2006

Related U.S. Application Data

(63) Continuation of application No. PCT/EP2005/000178, filed on Jan. 11, 2005.

(30) Foreign Application Priority Data

Feb. 5, 2004    (DE) .................. 10 2004 005 668

(51) Int. Cl.
*H01L 23/04* (2006.01)
*H01L 23/06* (2006.01)

(52) U.S. Cl. .............. 257/698; 257/778; 257/731; 257/729; 257/738; 438/26

(58) Field of Classification Search ........... 257/698, 257/778, 731, 728, 738, 787, 729; 438/26
See application file for complete search history.

(56) References Cited

U.S. PATENT DOCUMENTS

| | | | |
|---|---|---|---|
| 6,362,525 B1 * | 3/2002 | Rahim | 257/738 |
| 6,504,096 B2 * | 1/2003 | Okubora | 174/521 |
| 6,630,725 B1 * | 10/2003 | Kuo et al. | 257/659 |
| 7,259,032 B2 * | 8/2007 | Murata et al. | 438/26 |
| 2004/0040740 A1 * | 3/2004 | Nakatani et al. | 174/256 |
| 2004/0042186 A1 * | 3/2004 | Furukawa et al. | 361/760 |
| 2005/0034888 A1 | 2/2005 | Hoffmann et al. | |
| 2005/0062167 A1 * | 3/2005 | Huang et al. | 257/778 |

FOREIGN PATENT DOCUMENTS

| | | |
|---|---|---|
| DE | 10164494 A1 | 7/2003 |
| EP | 0896427 A2 | 2/1999 |
| EP | 1071126 A2 | 1/2001 |
| WO | 95/30276 | 11/1995 |
| WO | 03/058810 A1 | 7/2003 |

* cited by examiner

*Primary Examiner*—Kenneth A Parker
*Assistant Examiner*—Joseph Nguyen
(74) *Attorney, Agent, or Firm*—Mayback & Hoffman, P.A.; Gregory L. Mayback; Scott D. Smiley

(57) ABSTRACT

A modularly constructed electrical component having a module substrate, preferably, of Si, and having one or more preferably un-housed chips placed on the module substrate while being electrically connected thereto and each joined to the module substrate, e.g., by direct wafer bonding. A recess is provided in the module substrate so that a closed hollow space is formed when the chip is joined to the module substrate. The hollow space is not formed by a protective cap, which surrounds the chip and, with the module substrate, closes it on all sides. Rather it is formed by the joining of opposing contact areas of the chip underside and of the upper side of the module substrate. The component can be economically produced because it does not require a protective cap for creating the hollow space. The component has a higher yield than monolithic integration of the functional units.

34 Claims, 8 Drawing Sheets

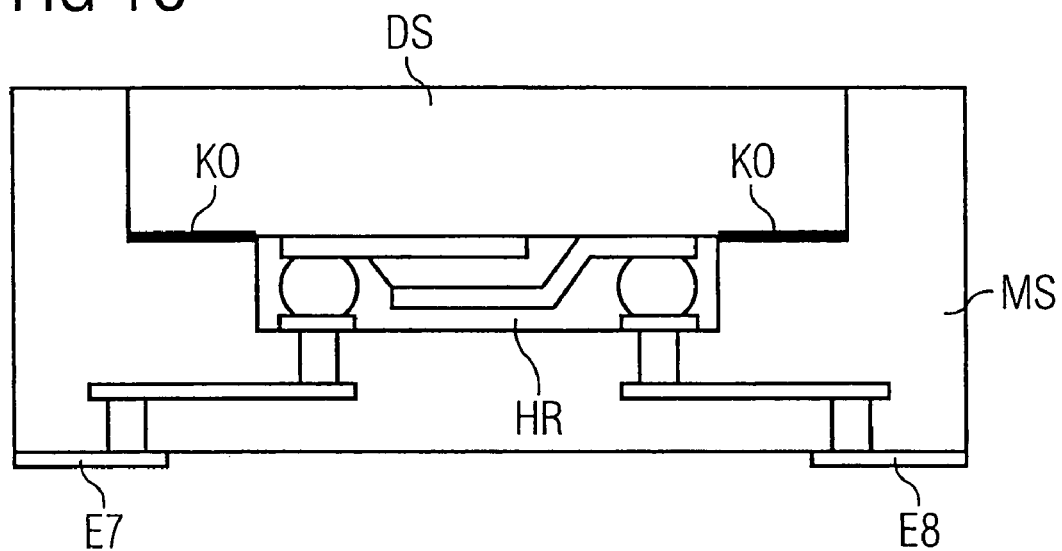
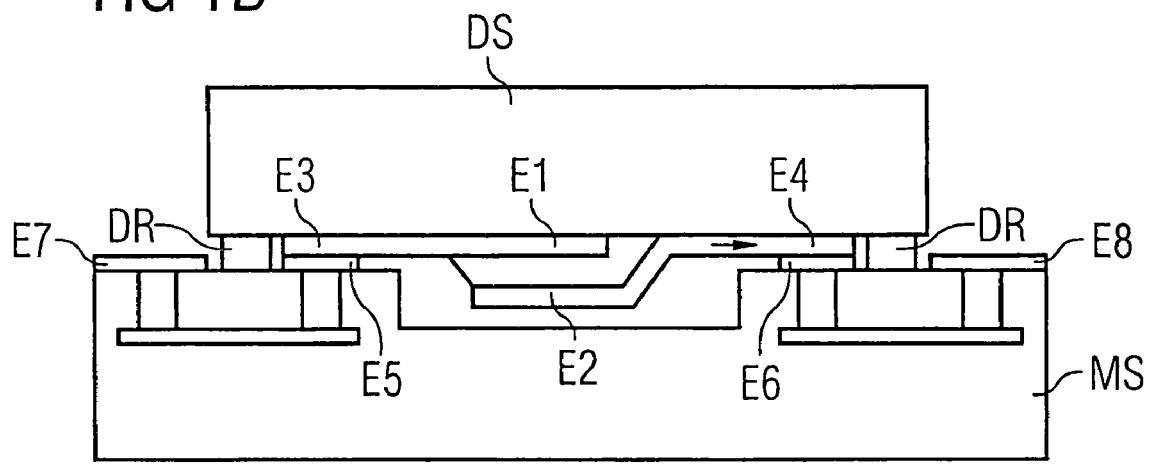

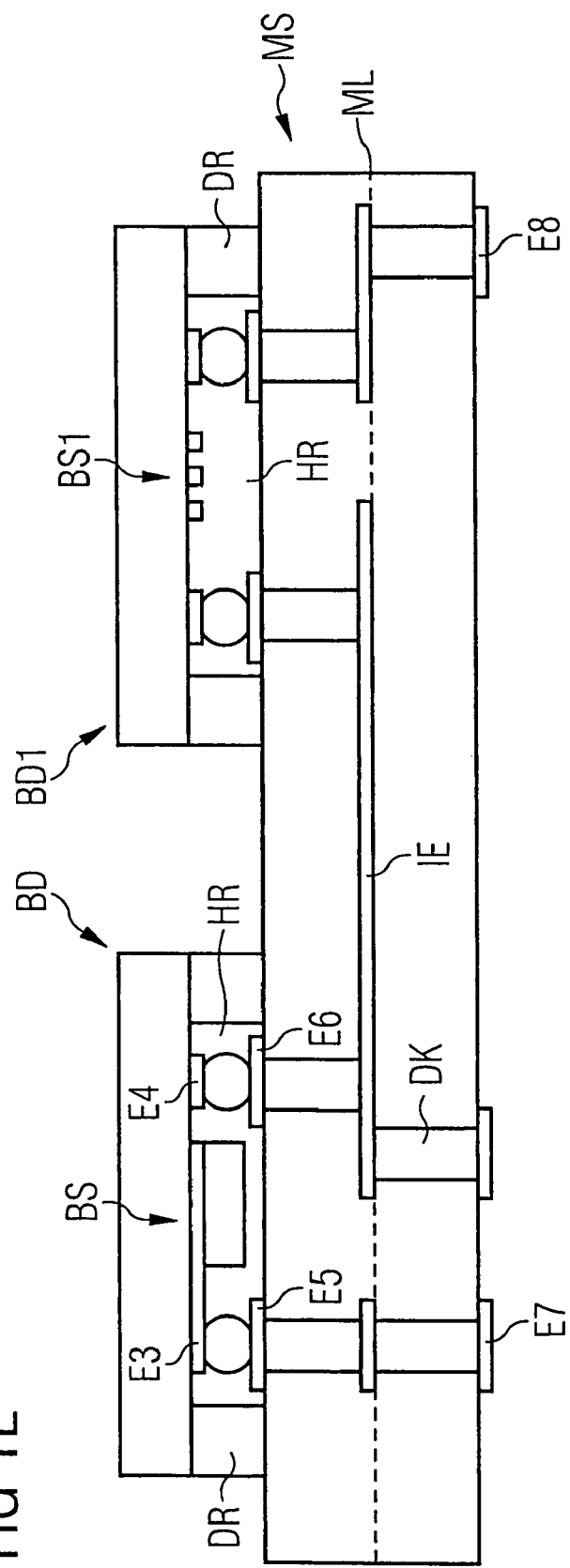

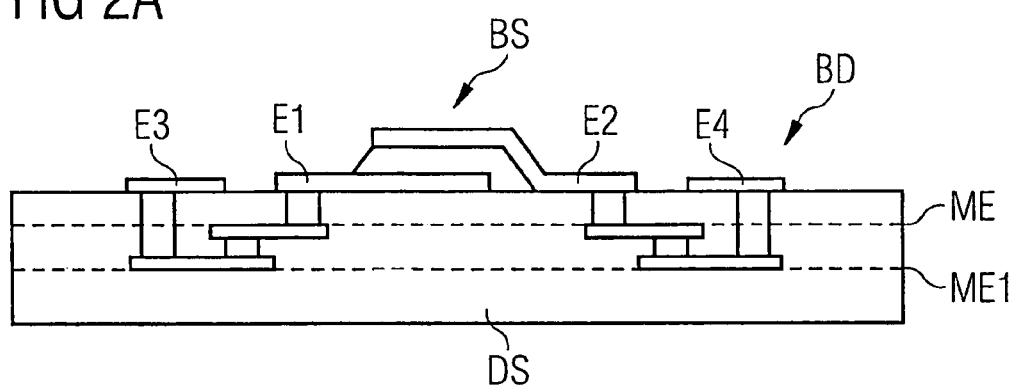
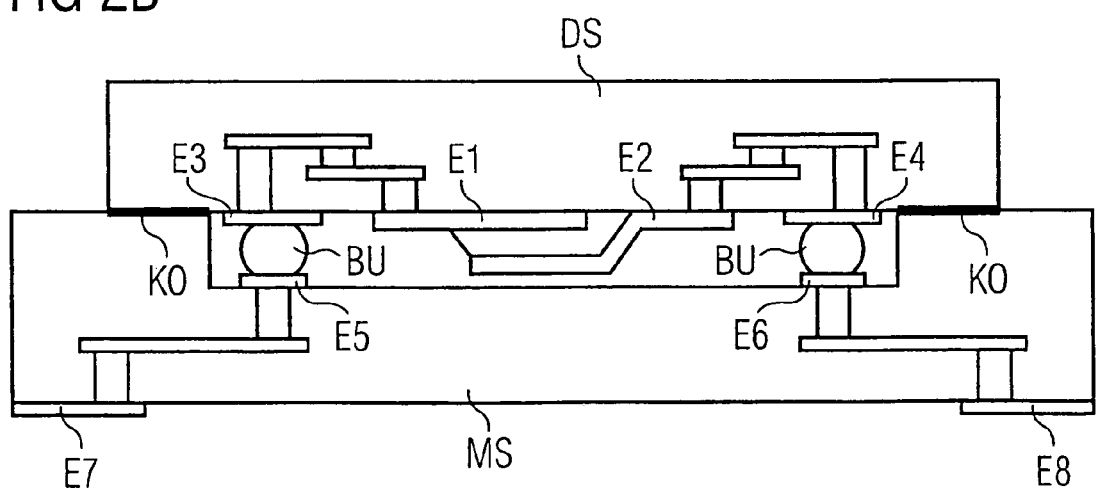

ELECTRICAL COMPONENT AND PRODUCTION THEREOF

CROSS-REFERENCE TO RELATED APPLICATIONS

This application is a continuation, under 35 U.S.C. §120, of copending international application No. PCT/EP2005/000178, filed Jan. 11, 2005, which designated the United States; this application also claims the priority, under 35 U.S.C. §119, of German patent application No. 10 2004 005 668.4, filed Feb. 5, 2004; the prior applications are herewith incorporated by reference herein in their entirety.

BACKGROUND OF THE INVENTION

Field of the Invention

The invention relates to a modularly constructed electrical component, preferably surface-mountable, with sensitive component structures, such as electro-acoustic transducers and a resonator, in particular.

Acoustic component structures are susceptible to environmental influences and, therefore, must be protected against them. On the other hand, these structures cannot simply be encapsulated, e.g., by a sealing compound, because the sealing compound influences the expansion of the acoustic wave. Accordingly, today, acoustic components are placed in a cavity. Obtaining and sealing such a cavity is extensive.

The necessary cavity can be formed, for example, by a protective cap. A chip carrying acoustic component structures on its active upper side can be connected or glued with its back side to a module substrate that simultaneously forms a part of a housing. The chip is covered by the protective cap, whereby the protective cap locks tightly with the module substrate.

It is known to assemble a chip carrying acoustic component structures on its active surface onto a module substrate with a plurality of, for example, ceramic layers in flip-chip configuration. The gap between the chip and the module substrate can, for example, be sealed by a sealing frame.

It is also possible to embody a protective cap that receives the component structures on the chip, whereby the electrical connections of the chip are located outside of the surface that is covered by the protective cap. The "bare", i.e., un-housed chip with component structures that are exposed on its surface will be referred to as "bare die" and will be differentiated from a discrete component. Contrary to a bare die, the discrete components having sensitive component structures are housed or at least provided with a protective cap.

Modularly constructed components, where discretely constructed components are assembled on a generally multi-layer ceramic module substrate, are also known. The present module integration of discrete electronic components, for example, with filters operating with acoustic surface waves or bulk waves, takes place by applying the housed components on the module substrate, whereby the terminals of the housed component are joined by existing joining technologies (for example, bond wires or bumps). Commonly, housing of the electronic components is necessary with exposed component structures because they are sensitive to environmental influences. The housing can take place, for example, with plastic or ceramic housings and bond wires or stud bumps, Chip Sized Package (CSP) housing technologies or wafer-level housings based on, for example, silicon or glass. When using micro-acoustic components, a material stress of the active component region must be avoided and is ensured by the formation of a cavity in the housing. With components so housed, the module substrates are subsequently equipped. Additional active and/or passive components are either integrated in the substrate material of the module or are placed onto the module substrate as discrete components and are electrically connected therewith through corresponding terminals. Subsequently, the completely equipped module can be cast with a suitable material (for example, glob-top-mass) to achieve a planar surface and to protect sensitive component structures from environmental influences.

The monolithic integration of different circuits into a common substrate (preferably, a semiconductor substrate such as silicon) provides a further possibility of producing a multi-functional module with a plurality of different active and/or passive components, whereby, depending on the complexity of the structures to be realized, a plurality of consecutive process sequences must be carried out. The component structures operating with acoustic waves, however, cannot be monolithically integrated into a module in a cost-effective manner.

It is known to produce a component by joining two wafers (wafer-level-package by direct wafer bonding), whereby a component structure embodied on a first wafer is enclosed and housed in a recess embodied in a second wafer. The wafers are, thereby, initially joined to one another and the interconnection of the wafers is separated into components.

SUMMARY OF THE INVENTION

It is accordingly an object of the invention to provide an electrical component and production method that overcome the hereinafore-mentioned disadvantages of the heretofore-known devices and methods of this general type and that has component structures to be protected and a method for producing the same in a cost-efficient manner.

With the foregoing and other objects in view, there is provided, in accordance with the invention, an electrical component, including a module substrate having an upper side, an underside, contact surfaces on the upper side, a frame-shaped closed contact region, and external contacts on one of the upper side and the underside, and at least one chip having a chip substrate having a circumferential edge region on the contact region of the module substrate on all sides thereof and completely and permanently mechanically joined therewith, component structures and terminal surfaces on the chip substrate and facing the module substrate, and the chip substrate being positioned at the module substrate to form a closed hollow space in which the component structures are disposed between the module substrate and the chip substrate.

With the objects of the invention in view, there is also provided an electrical component, including a module substrate having an upper side, an underside, contact surfaces on the upper side, a frame-shaped closed contact region, and external contacts on one of the upper side and the underside, at least one chip having a chip substrate having an edge region, and component structures and terminal surfaces on the chip substrate and facing the module substrate, a sealing frame disposed on the contact region of the module substrate and on the edge region of the chip substrate on all sides and completely and permanently mechanically joined therewith, and the module substrate, the chip substrate, and the sealing frame defining therebetween a closed hollow space in which the component structures are disposed.

The invention discloses a modularly constructed electrical component including a module substrate that serves as basis for the module. Contact surfaces for contacting one or a plurality of chips are provided on the upper side of the module substrate. The chips are the components of the module that are electrically connected with circuits integrated in the module substrate and are, thus, also switched with one another. External contacts for contacting the component with an external printed circuit board are provided on the underside of the module substrate.

At least one chip electrically connected with the module substrate is assembled on the upper side of the module substrate. The chip or, with a plurality of chips, at least one of the chips is a bare die (i.e., a "bare" chip) having a chip substrate with exposed component structures placed on its underside and contact surfaces for contacting the module substrate. The terminal surfaces of the chip substrate are directly electrically connected with the contact surfaces of the module substrate. The component structures face the module substrate.

At least one further chip can be placed on the module substrate as a housed discrete component.

The surface of the chip substrate facing the module substrate has a circumferential edge region that is mechanically permanently connected on all sides with the contact region of the module substrate located directly therebelow. A closed cavity receiving the component structures is, thereby, embodied between the module substrate and the chip substrate. The edge region of the underside of the chip completely surrounds the region of the component structures.

Installation locations for equipping with bare dies are provided in the module substrate or on the upper side of the module substrate, respectively.

In accordance with a further feature of the invention, the at least one chip is un-housed. As compared to modules equipped with discrete components, the use of un-housed chips as module components has an advantage that, when the "bare" chips are assembled on the module substrate, housing of the sensitive component structures of the chip takes place simultaneously.

In accordance with an added feature of the invention, the module substrate defines a recess on the upper side opposite a region of the component structures, the recess having a first surface area, the chip substrate has a surface facing the module substrate, the surface of the chip substrate having a second surface area larger than the first surface area, and the closed hollow space is between the chip substrate and the recess of the module substrate.

Contrary to the monolithic integration, i.e., integration of all circuits in a single monolithic component, the integration of the functional units on the upper side of a module substrate has the advantage of a high design flexibility because of the possibility of combining different components (for example, with different chip substrates or different suppliers) in a module. When realizing the functional unit, one is not limited to a single substrate material, for example, Si. Instead, bare dies can be combined with different substrate materials in a module. The construction of the module according to the invention from individual components (functional units) is advantageous, in particular, for changes to the design of the entire module. Furthermore, the equipment of the module with individual components provides the advantage that only tested components that have been indicated to be fully functional (known good dies) can be used for the equipment.

Exemplary embodiments of the invention are set forth in the text below.

In accordance with another feature of the invention, the module substrate has at least one region, for example a layer, made of silicon.

In accordance with a further feature of the invention, a component according to the invention has a module substrate made of Si.

In accordance with an added feature of the invention, a plurality of un-housed individual components (chips) are placed on and electrically connected with the module substrate. The individual components are electrically connected with one another through the connection lines provided in and/or on the module substrate.

The chip to be equipped on the module substrate can be, for example, a filter (Bulk Acoustic Wave (BAW) Filter) that operates with acoustic bulk waves.

In accordance with an additional feature of the invention, an exposed component structure that is to be protected is, particularly, a micro-electromechanical component and/or component structures operating with acoustic waves, for example, a resonator that operates with acoustic bulk waves or a transducer that operates with acoustic surface waves.

In accordance with yet another feature of the invention, in addition to the exposed component structures, the chip substrate can contain embedded and/or integrated passive and/or non-linear or active electronic components hidden on the inside of the substrate.

In accordance with yet a further feature of the invention, embedded components are components that are present as completed, preferably surface-mountable, discrete components, for example, SMD-capacitors, and that are introduced into the substrate or a substrate layer during the production of the substrate. The components are electrically connected with contact surfaces and subsequently hidden on the inside of the substrate by additional substrate layers that are to be applied.

Contrary thereto, integrated components are produced as component of the substrate during the production of the substrate, for example, by doping of the substrate material or as structured printed circuit boards between two dielectric layers, whereby these components do not exist as components prior to the production of the substrate.

In accordance with yet an added feature of the invention, the module substrate as a base for integration preferably contains circuits embedded and/or integrated on its inside that contain passive and/or active or non-linear components that were, preferably, produced with thick-layer and/or thin-layer technologies. Preferably, the integrated components embodied as structured conductor tracks are realized in metal layers of the module substrate located internally or are at least electrically contacted therewith, whereby the metal layers are separated from one another by dielectric or semiconductive layers. Horizontal connections as well as vertical electrical connections are provided in the module substrate. The connections electrically connect the integrated components with the bare dies (chips), on one hand, and with external contacts for connection with external components (for example, printed circuit board), on the other hand.

In accordance with yet an additional feature of the invention, the installation location for a bare die equipment can, for example, be carried out as a cavity in the module substrate having a smaller floor space than the base area of the bare die to be equipped so that the bare die, when applied, serves as upper closure or lid of the cavity. The region of the module substrate located outside of the cavity serves as mechanical support element for the bare die. The edge region of the surface of the chip substrate facing the module substrate is connected to the contact region of the module substrate adjoining the cavity. The mechanical connection between module substrate and bare die is created, preferably, by suitable wafer-bonding methods listed below.

After connecting the bare die with the module substrate, the cavity in the module substrate creates a closed hollow cavity that cannot be accessed from the outside in which the exposed component structures of the bare die are placed and protected or hermetically encapsulated from the environment during the use of a suitable wafer-bonding method.

In accordance with again another feature of the invention, and with reference to FIG. 2B, contact surfaces for electrically contacting the bare die are placed in the recess of the module substrate, whereby the connection between the equipped bare die and the module substrate takes place through these contact surfaces and the terminal surfaces of the bare die located opposite the contact surfaces through bumps, for example.

In accordance with again a further feature of the invention, the contact surfaces for contacting the bare die are placed outside of the recess around the recess, whereby the connection between the equipped bare die and the module substrate takes place through these contact surfaces and the terminal surfaces of the bare die that correspond to the contact surfaces through bond wires, for example.

In accordance with again an added feature of the invention, the installation location for a bare die equipment can, alternatively or in addition to a recess embodied in the module substrate, be defined by a connection frame placed on and permanently connected to the module substrate. On one hand, the connection frame serves as space maintainer between the chip substrate and the module substrate and, on the other hand, mechanically permanently connects the two substrates. In such a case, the connection frame and the area of the module substrate surrounded by it together form a recess or an installation location for a chip. The edge region of the chip is permanently connected with the connection frame. The chip underside, the connection frame, and the surface of the module substrate form a closed cavity.

German Published, Non-Prosecuted Patent Application DE 10164494 A1, corresponding to U.S. Patent Publication No. 2005/0034888 A1 and U.S. Pat. No. 6,982,380 B2 to Hoffman et al., discloses a component where a metal frame is provided between a module substrate and the chip underside. This frame is permanently connected with the module substrate and serves as space maintainer for the chip, however, it is not permanently connected to the chip underside. Hoffman et al. neither disclose nor suggest permanently connecting the surfaces of the module substrate and the chips with one another through such a frame. To attach the chip on the module substrate, the side surface of the chip must be metallized and permanently connected to the metal frame by a solder frame that is to be additionally applied. Contrary to such a component, the invention has the advantage of rendering unnecessary a metallization of the side surface of the chip and an additional solder frame.

A component according to the invention can be produced, for example, as set forth in the following text:

a) a first wafer having a plurality of component regions is provided, whereby installation locations in the form of connection frames for chips are provided in every component region;

b) individual chips (bare die components) are provided in that, for example, at least a second wafer is separated into individual chips;

c) the first wafer is equipped with the chips such that closed cavities between the first wafer and every chip are formed in the region of the installation locations;

d) the chips are electrically and mechanically permanently connected with the first wafer; and e) the components thus generated in the component regions are separated.

With the objects of the invention in view, there is also provided a method for producing a component, including the steps of providing a wafer with a plurality of component regions as the module substrate and with installation locations for installing chips thereat, equipping individual chips in the component regions of the wafer to form a respective closed cavity between the first wafer and each of the chips, and permanently electrically and mechanically connecting the chips with the wafer to thereby isolate the created components that are each associated with one of the component regions.

With the objects of the invention in view, there is also provided a method for producing a component, including the steps of providing a wafer with a plurality of component regions as a module substrate, the module substrate having an upper side, an underside, contact surfaces on the upper side, a frame-shaped closed contact region, external contacts on one of the upper side and the underside, and installation locations for installing chips thereat, equipping individual chips in the component regions of the wafer to form a respective closed cavity between the first wafer and each of the chips, each of the chips having a chip substrate having a circumferential edge region on the contact region of the module substrate on all sides thereof and completely and permanently mechanically joined therewith, component structures and terminal surfaces on the chip substrate and facing the module substrate, and the chip substrate being positioned at the module substrate to form a closed hollow space in which the component structures are disposed between the module substrate and the chip substrate, and permanently electrically and mechanically connecting the chips with the wafer to thereby isolate the created components that are each associated with one of the component regions.

In accordance with again an additional mode of the invention, the encapsulation of sensitive component structures is achieved solely by the connection of the module substrate present as a wafer with the separated and un-housed chips. With this new encapsulation, an additional housing of the chips for providing a closed cavity for exposed component structures is no longer necessary. To dispense with a suitable housing for the component to be equipped-means that no corresponding housing costs are incurred.

Contrary to components with monolithic integration, the total yield during a module production with the bare die equipment according to the invention does not result in a product of the yields of the individual process sequences for the realization of the individual functional units or switches on the wafer, but from the yields that result during the chip production and the connection of the chip with the module substrate. Prior to equipment, the chips can thereby be tested and the faulty chips can be sorted out. Thus, a high yield can be achieved with the method according to the invention.

Advantages of the method are low housing costs, a small module height, and a high yield.

In accordance with still another feature of the invention, the first wafer is a Si-wafer. The first wafer can also be a wafer that only has partial regions made of Si. It can also partly or completely be made of ceramic.

In accordance with still a further mode of the invention, the installation locations are embodied in the form of recesses on the upper side of the module substrate, whereby the chips are equipped directly on the contact regions of the module substrate that are around these recesses and are permanently connected therewith. In such a case, the mechanical connection between the chip and the module substrate can take place through wafer bonding, for example, anodic surface bonding, direct surface bonding, or surface-activated bonding.

However, it is also possible to add a connection layer or a connection frame between the contact region of the module substrate and the contact region of the chip substrate located opposite thereto, which is placed around the recess and is to be connected with the chip. The connection frame connects the chip underside with the surface of the substrate and provides for the sealing of the closed cavity.

In accordance with still an added mode of the invention, connection frames that each are around a recess of the module substrate and that are each equipped with a chip can be embodied on the upper side of the module substrate. When a connection frame is used, a cavity can be formed after the equipment even without additional recesses in the module substrate. Subsequently, the connection frames are mechanically permanently connected with the edge region of the chips, whereby closed cavities are created.

In accordance with still an additional mode of the invention, it is possible to embody or attach the installation locations in the form of connection frames on the upper side of the module substrate without additional recesses. The connection frames are embodied on the underside of or on the side of the second wafer that carries the component structures that are to be housed or in the edge region of the chips, respectively, whereby the second wafer is, then, separated into chips. The module substrate is equipped with chips such that the connection frames face towards the upper side of the module substrate. Subsequently, the connection frames are mechanically permanently connected with the surface of the module substrate, whereby closed cavities are created.

In accordance with another mode of the invention, the connection frame is chosen to be made of an electrically insulating material, for example, glass frit, silicon oxide, or an adhesive material. In another variant, the connection frame is made of metal or solder, whereby this layer can, then, be mechanically permanently connected to the surface of the chip substrate, on one hand, for example, by eutectic bonding or thermo-compression, and, on the other hand, to the surface of the module substrate. Preferably, a first metal structure is generated on the upper side of the module substrate around the recess by coating of the substrate surface. This metal structure defines the recess on all sides and serves as support for a connection frame made of solder. On the underside of the chip substrate, at least in the edge region, a corresponding second metal structure located opposite the first metal structure or the solder frame, respectively, is generated during equipment of the chip. The solder frame is heated above its melting temperature and, thereby, connects the chip substrate and the module substrate.

In accordance with a further feature of the invention, as indicated in FIG. 1C, the recess in the module substrate is preferably embodied in a cascaded manner, whereby a recess with a smaller floor space than the first recess is embodied in a first recess which can receive the entire chip.

The floor space of the first recess can also be embodied larger than the base area of the chip. The spaces can then be closed with a sealing compound.

When the height of the chip exceeds the depth of the first recess, the upper side of the component is, preferably, planarized, whereby a part of the chip substrate is removed from the back side, for example, by chemical mechanical polishing or by a sandblast.

Other features that are considered as characteristic for the invention are set forth in the appended claims.

Although the invention is illustrated and described herein as embodied in an electrical component and production method, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

In the following, the invention will be described in more detail by exemplary embodiments and the corresponding figures. By schematic illustrations that are not true to scale, the figures show different exemplary embodiments of the invention. The same or equally functioning parts are characterized with the same reference numerals. Shown are sections in schematic cross-section.

FIG. 1C is a fragmentary, diagrammatic, cross-sectional view of another component according to the invention where the chips are connected with the module substrate by direct wafer bonding;

FIG. 1D is a fragmentary, diagrammatic, cross-sectional view of a component according to the invention where the chips are connected with the module substrate by a frame;

FIG. 1E is a fragmentary, diagrammatic, cross-sectional view of a first exemplary variant of the component shown in FIG. 1D;

FIG. 2A is a fragmentary, diagrammatic, cross-sectional view of an exemplary bare die where the connection lines between the component structures and the terminal surfaces are hidden in the chip substrate;

FIG. 2B is a fragmentary, diagrammatic, cross-sectional view of a component according to the invention with a bare die according to FIG. 2A, whereby the chips are connected with the module substrate by a frame;

DESCRIPTION OF THE PREFERRED EMBODIMENTS

Figure 1A:
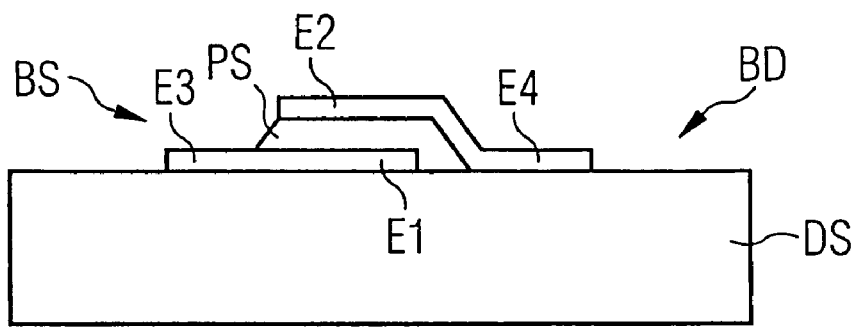
FIG. 1A is a fragmentary, diagrammatic, cross-sectional view of an exemplary bare die where the connection lines are placed between the component structures and the terminal surfaces on the surface of the chip substrate.

Referring now to the figures of the drawings in detail and first, particularly to a first exemplary embodiment of FIGS. 1A to 1D thereof, there is shown a chip that is provided as un-housed component (bare die) for the further connection with a module substrate and includes a chip substrate with component structures that, preferably, realize a filter circuit. In schematic cross-section, FIG. 1A shows an exemplary bare die BD with an acoustic bulk wave resonator as component structure BS, illustrated in a simplified manner. This resonator is constructed on a chip substrate DS in thin-film technologies and substantially includes two resonator electrodes E1, E2 and a piezoelectric layer PS placed therebetween. The acoustically active region of the resonator is defined by the overlapping region of the two electrodes E1 and E2. The electrode E1 is electrically connected with a terminal surface E3. The electrode E2 is electrically connected with a terminal surface E4. In this case, the connection lines between the electrodes and the terminal surfaces are located on the surface of the chip substrate DS.

The component structures that are exposed on the surface of the chip substrate can also contain transducers operating with acoustic surface waves, passive and/or active or non-linear electronic components.

Figure 1B:
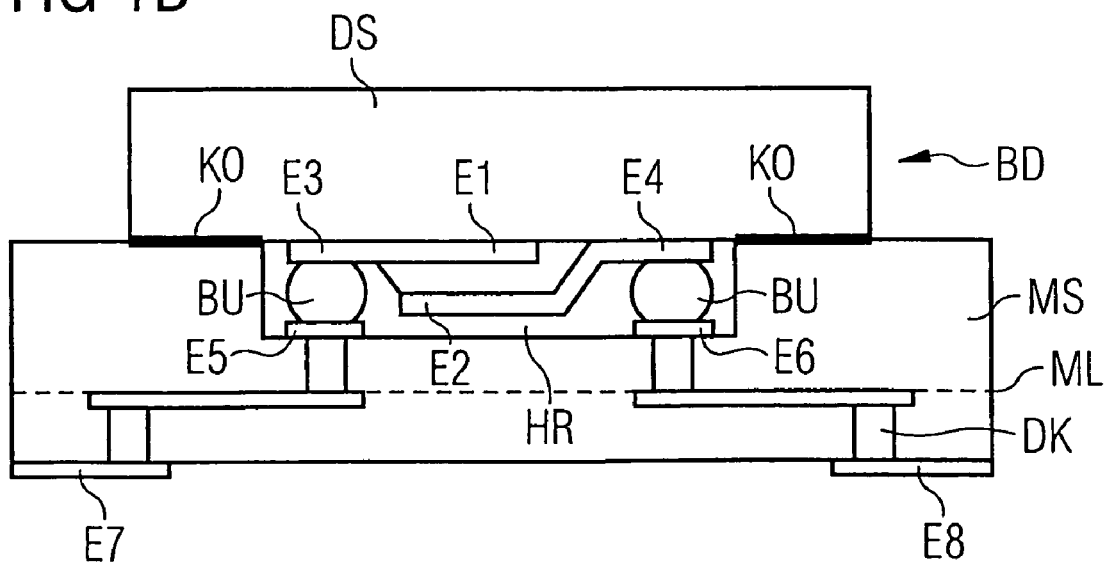
FIG. 1B is a fragmentary, diagrammatic, cross-sectional view of a component according to the invention where the chips are connected with the module substrate by direct wafer bonding.

FIG. 1B shows, in sections, a component according to the invention with a module substrate MS and a bare die BD equipped thereon according to FIG. 1A. The bare die includes a bulk wave resonator. The component according to the invention furthermore contains at least one additional chip placed on the upper side of the module substrate MS or a further bare die that are not shown in the figures.

The terminal surfaces E3, E4 of the bare die are electrically connected with the contact surfaces E5, E6 of the module substrate MS by bumps BU. The bare die BD is mechanically permanently connected with the module substrate MS by direct wafer bonding so that a mechanically stable and sealing connection is produced in the contact region KO between the module substrate MS and the chip substrate DS.

The connection of the component with an external printed circuit board takes place through the external contacts E7, E8 placed at the underside of the module substrate.

In such a variant of the invention, the module substrate MS is embodied in a multi-layer manner and has at least one structured metal layer ML located on the inside of the substrate.

The module substrate MS has connection lines and integrated electronic components that are embodied in the metal layers ML, whereby every interior metal layer ML is placed, for example, between two semiconductive layers, Si-layers. Preferably, the semiconductive layers are highly resistive. It is also possible that these layers are multi-layer in construction and, in addition to one or a plurality of Si-partial layers, contain additional, preferably, electrically non-conductive partial layers, for example, made of $SiO_2$. In the layer connection, the non-conductive partial layers are, preferably, the external layers.

The components integrated in the module substrate or in the chip substrate can be passive circuit elements—for example, coil, capacitor, resistor, strip or triplate line, transformer—or non-linear or active circuit elements—for example, diode, switch, transistor. Preferably, the passive components are realized as conductor tracks.

Here, the surface of the chip substrate facing the module substrate has a larger area than the floor space within the cavity formed on the upper side of the module substrate.

The two substrates are joined together such that a hollow space HR or an air gap remains between the sensitive component structures and the module substrate in the region of the component structures, i.e., at least between the acoustically active resonator region and the module substrate MS. Prior to attaching the bare die, the bumps can either be attached on the terminal surfaces E3, E4 of the bare die or on the contact surfaces E5, E6 of the module substrate MS.

In such a variant, the component according to the invention is suitable for surface mounting. The contact surfaces E5, E6 and the external contacts E7, E8 are electrically connected with one another through the connection lines placed in the module substrate, the through-contacts DK, and, if applicable, through the hidden integrated electronic components.

Ideally, an identical material (for example, silicon) is used for the chip substrate as well as for the module substrate to minimize tensions at the junction of the two substrates due to different thermal expansion coefficients. For substrates with a multi-layer construction it is advantageous that at least the layers facing each other are made from the same material and, in particular, from Si.

Si as module substrate MS furthermore provides the advantage of large available wafer diameters so that a large number of components can be obtained from every wafer. Additionally, silicon has the advantage that thin-film processes with a high lateral accuracy for realizing efficient components even above 10 GHz, as well as reliable thinning methods for the wafers for achieving small component heights that are reliable, are available for this material.

However, other materials, for example, multi-layer ceramic (for example LTCC: low temperature co-fired ceramic) or multi-layer organic substrates (for example, FR4) with integrated and/or embedded electronic components can also be used. Depending on the materials that are used, different measures for preparing the surface region of the chip substrate and/or the module substrate provided as contact surface are necessary for the wafer bonding method, for example, surface coating with a suitable material (for example, resin, $SiO_2$, organic or inorganic adhesives, metal/solder), surface activation by physical and/or chemical treatment (for example, wet- or dry-etching methods, plasma treatment, wetting of the surface with chemicals), polishing steps for producing planar contact surfaces, such as chemical mechanical polishing.

FIG. 1C shows an advantageous embodiment of the variant of the invention introduced in FIG. 1B. Here, the cavity for receiving the component structures is embodied in a further cavity that serves for receiving the chip substrate DS. The chip substrate DS is seated on a step that is embodied by the nesting of the cavities. In the contact region KO, the substrates DS and MS are connected such that a closed and, preferably, hermetically tight hollow space HR is created.

A step-shaped cavity in the module substrate MS has the advantage that a planar surface can be achieved on the upper side of the component after placing the bare die or after a corresponding planarization process.

FIG. 1D shows an alternative configuration of the bare die on the module substrate MS. In this case, the connection between the terminal surfaces E3, E4 of the chip substrate DS and the contact surfaces ES, E6 of the module substrate MS takes place without bumps. The terminal or contact surfaces E3 to E6, respectively, contain such a material or a thin layer made of such a material that forms a strong bond with a metal surface, for example, solder, when subjected to thermal influences.

In this exemplary embodiment, the connection between the module substrate MS and the bare die is established by a sealing frame DR (connection frame) of a suitable material.

The sealing frame can be a metal frame that was applied on the surface of the module substrate MS or the chip substrate DS, in a separation process, for example. However, it is also possible that the metal frame is connected with a metal structure that surrounds the component structures on all sides, provided on the corresponding substrate surface by a solder connection.

The sealing frame can be a solder frame that is not applied directly on the substrate surface, but on a metal coating that is provided on the substrate surface in the region located below this frame.

In another variant, the sealing frame can be made of an electrically insulating material. The sealing frame DR can be a grouting material, such as resin or another material with adhesive characteristics. It is also possible to choose the sealing frame from organic or inorganic adhesives.

This exemplary embodiment also results in a hollow space or an air gap between the active resonator region or the sensitive components structures and the surface of the module substrate MS. Here, the closed hollow space is formed between the module substrate MS, the chip substrate DS, and the sealing frame DR.

In the exemplary embodiment shown in FIG. 1D, the contact surfaces E5, E6 are placed on the upper side of the module substrate MS outside of the cavity provided in the module substrate. The contact surfaces E5, E6, as well as the terminal surfaces E3, E4, however, are preferably located in the closed hollow space.

It is also possible for the contact surfaces E5, E6 to be placed in the cavity of the module substrate. Bump connections are, then, created between the terminal surfaces E3, E4 and the contact surfaces E5, E6, respectively, whereby a sealing frame is used simultaneously between the module substrate MS and the bare die.

In the exemplary embodiment shown in FIG. 1D, the external contacts E7, E8 of the component are located on the upper side of the module substrate MS outside of the area covered by the chip substrate DS. The electrical connection of the component to an external printed circuit board can be established through these external contacts, for example, by bond wires.

In this exemplary embodiment, the contacts E7, E8 can also be used for contacting additional (preferably, housed) chips of the same module. Connections between different module components placed on the module substrate can also be established through a connection line that is hidden inside the module substrate MS. In another variant, the realization of connection lines or external contacts is also possible with corresponding lead-throughs on the underside of the module substrate. See FIG. 1B.

FIG. 1E illustrates a further advantageous variant of the invention, where by a sealing frame DR, a plurality of chips BD, BD1 are attached on the module substrate MS with a plane surface or without cavities. Here, the sealing frame DR serves as distancing element between the module substrate MS and the chip and connects the edge region of the chip and the contact region of the module substrate MS in a mechanically permanent manner so that a closed hollow space HR is created. In this example, a cavity for receiving component structures is embodied not in the module substrate MS itself, as in FIG. 1D, but is defined by the sealing frame DR and the planar surface of the module substrate MS surrounded by and located lower than the sealing frame DR. The sealing frame DR, thereby, has a sufficient height for receiving component structures.

FIG. 1E indicates that the second chip BD1 has a component structure BS1 that operates with surface waves. An integrated component IE is embodied in the metal layer ML of the module substrate MS.

Figure 1F:
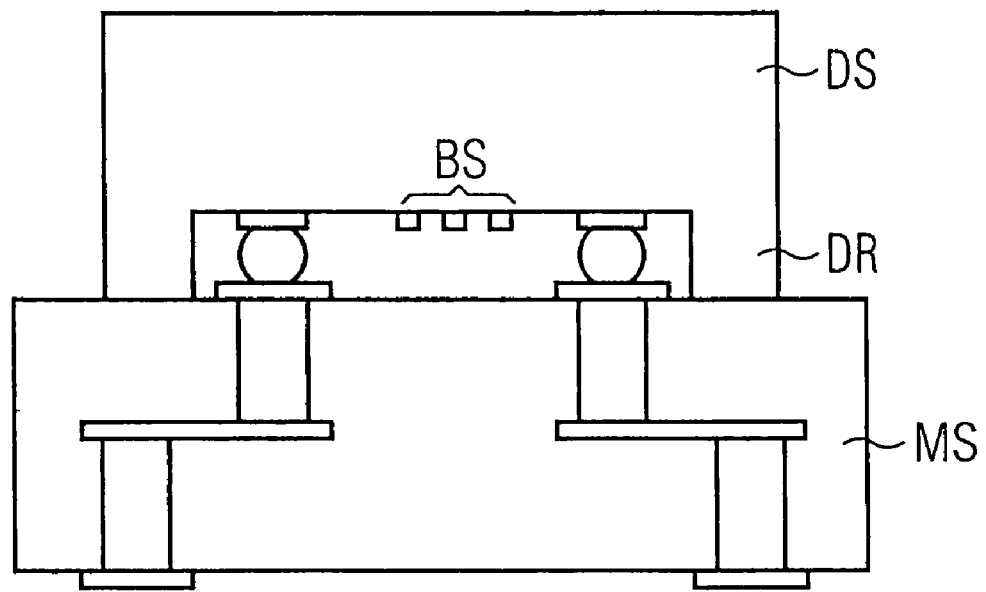
FIG. 1F is a fragmentary, diagrammatic, cross-sectional view of a second exemplary variant of the component shown in FIG. 1D.

A structure similar to a sealing frame can be embodied in the edge region of the chip substrate DS, shown in a further variant in FIG. 1F. In such an embodiment, a cavity is provided on the chip underside in the region of the component structures or outside of the edge region, respectively.

Figure 1G:
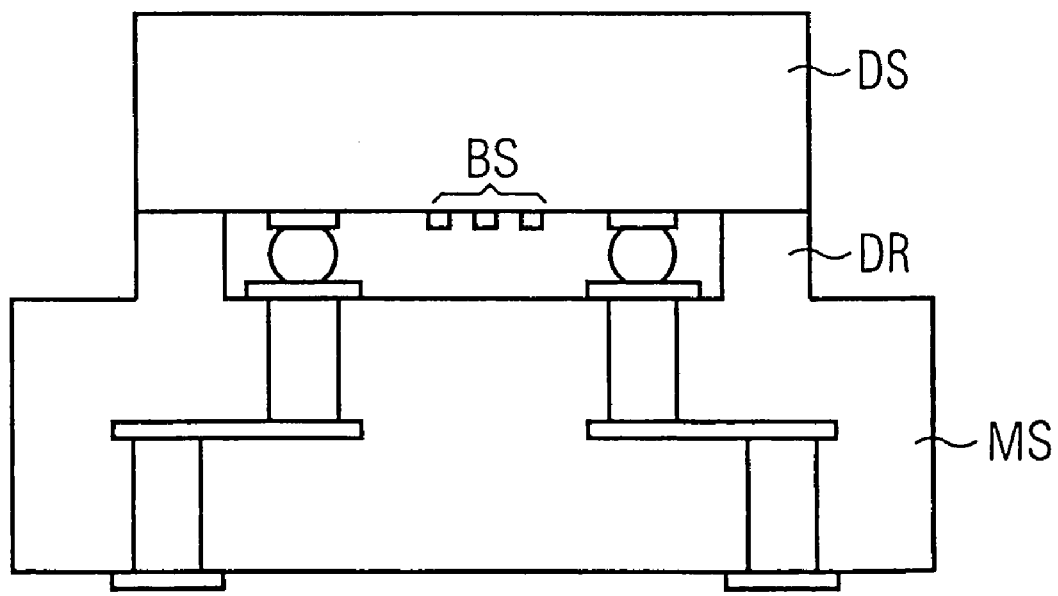
FIG. 1G is a fragmentary, diagrammatic, cross-sectional view of a third exemplary variant of the component shown in FIG. 1D.

Alternatively, it is possible to create a connection frame, as indicated in FIG. 1G, by structuring the upper side of the module substrate MS.

Further variants for forming a frame are possible in combination with the embodiments of FIG. 1 to 11 introduced in Hoffman et al., which are incorporated herein by reference in their entirety.

A second exemplary embodiment is illustrated in FIGS. 2A to 2D.

FIG. 2A shows, in schematic cross-section, a bulk wave resonator embodied in thin-film technology, which is located on a chip substrate DS with integrated electronic circuit components. The resonator electrodes E1, E2 are connected with the terminal surfaces E3, E4 of the bare die through the electronic circuit components and electrical connections hidden in the chip substrate DS. The integrated circuit components are embodied, for example, in structured metallization planes ME, ME1.

The metallization planes ME, ME1 are placed between two dielectric layers.

In the exemplary embodiment illustrated in FIG. 2B, analogously to FIG. 1B, the bare die BD is connected by wafer bonding method in the contact region KO with the module substrate MS that, preferably, contains integrated electronic circuit elements. This case also again results in a hollow space or an air gap, respectively, between the active resonator region and the surface of the module substrate, whereby bumps BU connect the terminal surfaces E3, E4 with the contact surfaces E5, E6. As in FIG. 1B, the terminal pads E7 and E8 are located on the underside of the module substrate MS.

Figure 2C:
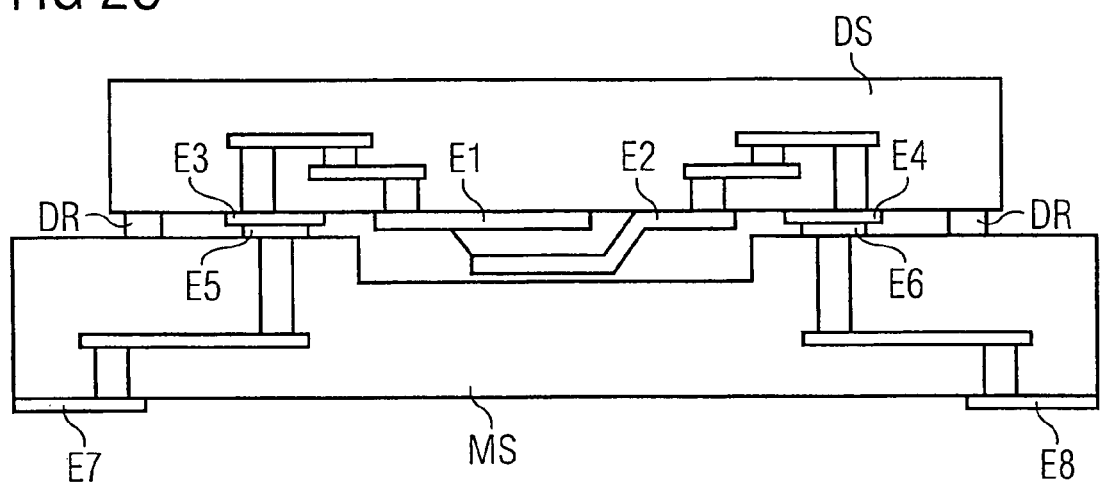
FIG. 2C is a fragmentary, diagrammatic, cross-sectional view of a further component according to the invention with a bare die according to FIG. 2A, whereby the chips are connected with the module substrate by a frame.

FIG. 2C shows a further component according to the invention with the configuration substantially corresponding to FIG. 1D, using a bare die according to FIG. 2A. The terminal surfaces E3, E4 of the chip substrate DS are connected, electrically directly and without bumps, with the corresponding contact surfaces E5, E6 of the module substrate MS. A hollow space is formed by the sealing frame DR, the chip substrate DS, and the module substrate MS, whereby the electrical connection of the two substrates DS and MS takes place in this hollow space. The terminal pads E7, E8 are located on the underside of the module substrate MS.

Figure 2D:
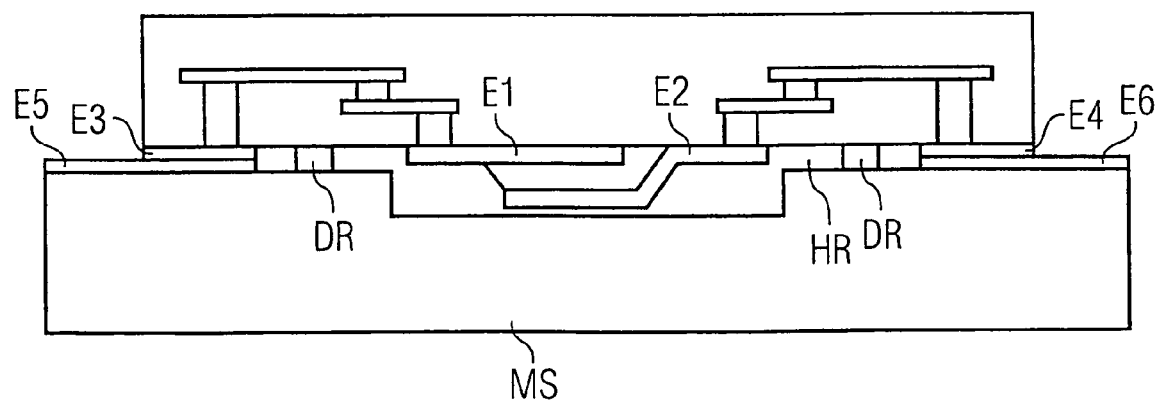
FIG. 2D is a fragmentary, diagrammatic, cross-sectional view of another component according to the invention with a bare die according to FIG. 2A, whereby the chips are connected with the module substrate by a frame.

At least in the illustrated area, the module substrate MS in FIG. 2D does not contain any integrated electronic component. The contact surfaces E5, E6 on the module substrate MS can either serve for connecting the component with an external printed circuit board or can represent parts of a connection line to non-illustrated chips or bare die of this component.

In this example, the terminal surfaces E3, E4 and the corresponding contact surfaces E5, E6 are placed outside of the closed hollow space HR, whereby the terminal surfaces E3, E4 of the chip substrate DS are located directly opposite the contact surfaces E5, E6 of the module substrate MS.

In a variant of the exemplary embodiment illustrated in FIG. 2D, it is possible to place the contact surfaces E5 and E6 of the module substrate MS in the substrate cavity and to establish the electrical connection between the terminal surfaces E3, E4 and the contact surfaces E5 or E6, respectively, through bumps.

A third exemplary embodiment is illustrated in FIGS. 3A to 3D.

Figure 3A:
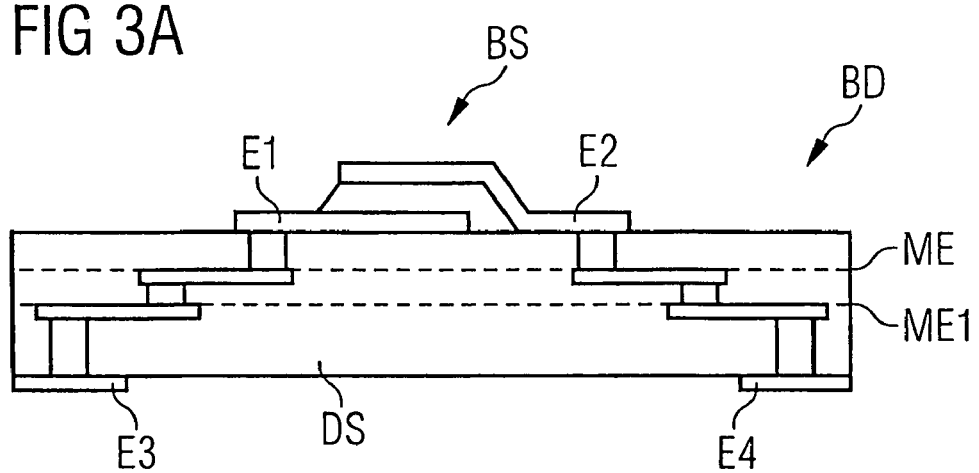
FIG. 3A is a fragmentary, diagrammatic, cross-sectional view of another exemplary bare die where the connection lines between the component structures and the terminal surfaces are hidden in the chip substrate.

FIG. 3A represents a bare die with a bulk wave resonator embodied in thin-film technology placed on the chip substrate DS. The chip substrate DS contains integrated electrical circuits being electrically connected with the resonator. In this variant, the terminal surfaces E3 and E4 are located on the surface of the chip substrate DS opposite the resonator electrodes E1, E2.

Figure 3B:
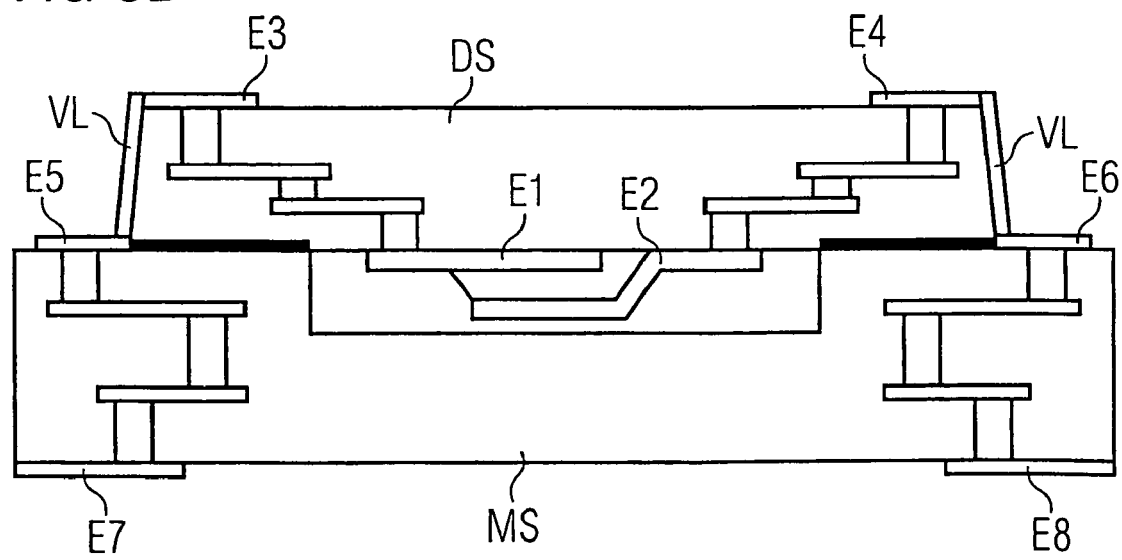
FIG. 3B is a fragmentary, diagrammatic, cross-sectional view of a component according to the invention with a bare die according to FIG. 3A.

FIG. 3B shows a component according to the invention with a bare die according to FIG. 3A being placed on a module substrate MS with integrated electronic circuit components. The contact surfaces E5, E6 are placed on the upper side and the external contacts E7, E8 are placed on the underside of the module substrate MS.

The electrical connection between the terminal surfaces E3, E4 and the corresponding contact surfaces E5, E6 takes place through connection lines VL guided along the edge of the chip substrate DS. An edge angle greater than 90° may be advantageous here for sufficient edge coverage of the side surfaces of the chip substrate that may be achieved, for example, with a suitable sawing method during separation of the dies.

Figure 3C:
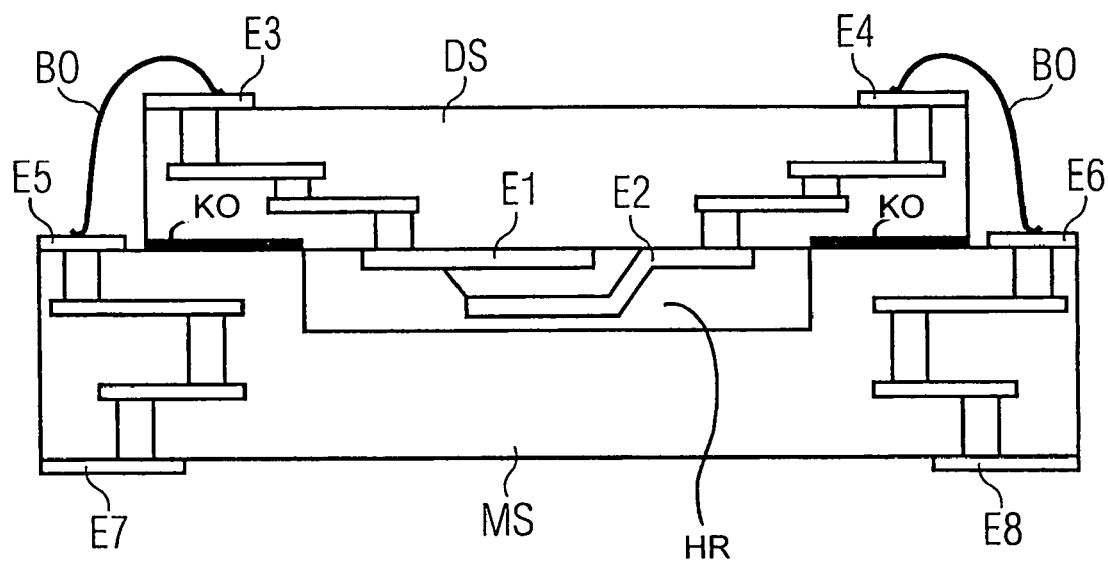
FIG. 3C is a fragmentary, diagrammatic, cross-sectional view of a further component according to the invention with a bare die according to FIG. 3A.

Contrary to FIG. 3B, the connection between the terminal surfaces E3, E4 and the contact surfaces E5 or E6, respectively, introduced in FIG. 3, takes place through bond wires BO as shown in FIG. 3C.

Figure 3D:
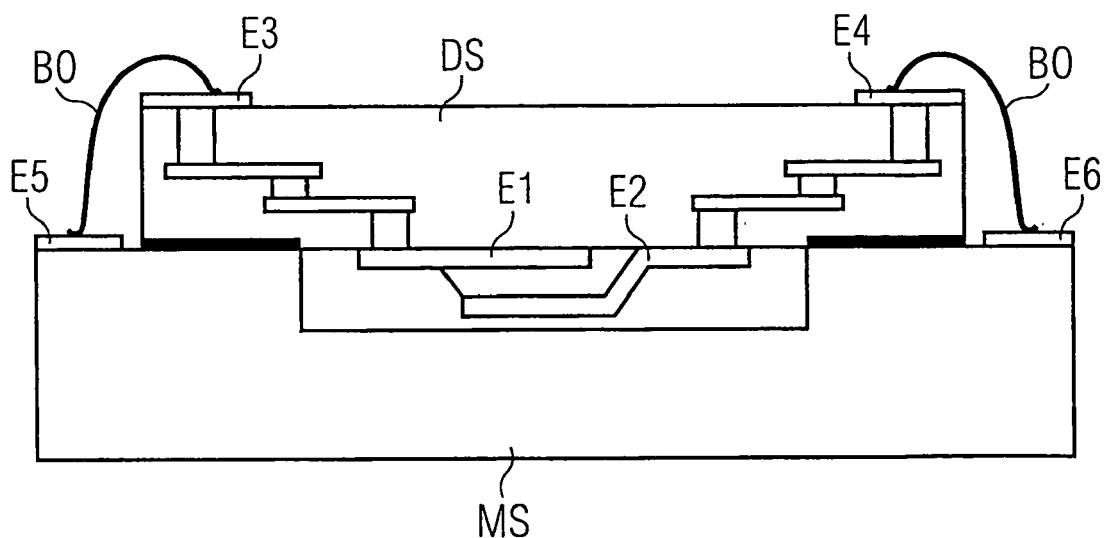
FIG. 3D is a fragmentary, diagrammatic, cross-sectional view of another component according to the invention with a bare die according to FIG. 3A.

At least in the illustrated region, the module substrate MS in FIG. 3D does not contain integrated electronic components. Bond wires BO also connect the terminal surfaces E3, E4 and the contact surfaces E5, E6. The further connection of the illustrated region of the component to further (non-illustrated) component regions or to an external printed circuit board can take place through the contact surfaces E5 and E6.

In all of the illustrated exemplary embodiments, a region with a hollow space or air gap between active resonator surface and the surface of the module substrate protected against environmental influences or, with a corresponding selection of the connection technology, even hermetically sealed against the environment, is created after connecting the module substrate and the bare die. The invention is not limited to the exemplary embodiments introduced in the figures, to the form, the function, or the number of the elements schematically illustrated therein.

With a module according to the invention, the chips can be covered with a protective cap that locks with the upper side of the module substrate. The protective cover can form an additional hollow space, in which a plurality of chips is placed together. However, it is also possible that a corresponding cavity is provided in the protective cap for one chip each. It is also possible that the chips are cast with a sealing compound in the module. However, these additional encapsulation elements and sealing are not used for protecting exposed component structures of the chip, but for protecting the chip as a whole.

The module substrate as well as the chip substrate can be embodied in a multi-layer manner and can contain a plurality of dielectric layers. The dielectric layers can be made of a ceramic or organic material, for example, polymer.

I claim:

1. An electrical component, comprising:
   a module substrate having:
      an upper side;
      an underside;
      contact surfaces on said upper side;
      a frame-shaped closed contact region; and
      external contacts on one of said upper side and said underside; and
   at least one chip having:
      a chip substrate having a circumferential edge region on said contact region of said module substrate on all sides thereof and completely and permanently mechanically joined therewith;
      component structures and terminal surfaces on said chip substrate and facing said module substrate; and
      said chip substrate being positioned at said module substrate to form a continuous and circumferential permanent joint directly between the frame-shaped closed continuous and circumferential contact region and the circumferential edge region that defines a closed hollow space in which said component structures are disposed between said module substrate and said chip substrate,
   wherein:
      said module substrate defines a recess on said upper side opposite a region of said component structures;
      said closed hollow space is between said chip substrate and said recess of said module substrate;
      said circumferential edge region of said chip includes silicon; and
      said mechanically joined connection between said module substrate and said chip is created by a wafer bonding method.

2. The component according to claim 1, wherein said at least one chip is un-housed.

3. The component according to claim 1, wherein said module substrate has at least one region of silicon.

4. The component according to claim 1, wherein:
   said recess has a first surface area;
   said chip substrate has a surface facing said module substrate, said surface of said chip substrate having a second surface area larger than said first surface area; and
   said closed hollow space is between said chip substrate and said recess of said module substrate.

5. The component according to claim 4, wherein said surface of said chip substrate facing said module substrate has a chip contact region directly on said contact region of said module substrate and is permanently mechanically connected with said contact region of said module substrate.

6. The component according to claim 1, wherein:
   said module substrate has:
      interior metal layers;
      dielectric layers between said metal layers;
      external contacts; and
      contact surfaces;
   through-contacts electrically connect said metal layers to said external contacts and to said contact surfaces.

7. The component according to claim 1, further comprising at least one of integrated and embedded electronic components embodied inside said module substrate, said components being at least one of at least one of active and passive components.

8. The component according to claim 1, wherein said terminal surfaces face said module substrate.

9. The component according to claim 4, wherein:
said terminal surfaces are directly opposite said contact surfaces;
said terminal surfaces and said contact surfaces are in said closed hollow space; and
said contact surfaces are outside said recess.

10. The component according to claim 1, wherein said terminal surfaces and said contact surfaces are outside said closed hollow space.

11. The component according to claim 1, wherein:
said chip substrate has an upper side facing away from said module substrate;
said terminal surfaces are on said upper side; and
through-contacts electrically connect said terminal surfaces with said component structures.

12. The component according to claim 11, further comprising bond wires connecting said terminal surfaces and said contact surfaces to one another.

13. The component according to claim 12, wherein:
said chip substrate has an external edge; and
connection lines extend at said external edge of the chip substrate to connect said terminal surfaces and said contact surfaces are connected with one another.

14. The component according to claim 11, wherein said chip substrate has:
a plurality of layers selected from at least one of group consisting of dielectric layers and semiconductive layers; and
metallization planes located between said layers; and
said terminal surfaces are electrically connected with said component structures through said metallization planes and said through-contacts.

15. The component according to claim 14, further comprising one of integrated active and passive electronic components in said chip substrate.

16. The component according to claim 1, wherein at least one of said component structures is at least one of the group consisting of a resonator operating with acoustic bulk waves, a transducer operating with acoustic surface waves, and a MEMS microelectromechanic component.

17. The component according to claim 1, further comprising electrical connections in an interior of said chip substrate.

18. The component according to claim 4, wherein said at least one chip is sunk into said recess of said module substrate.

19. The component according to claim 1, wherein said chip substrate defines a recess in which said component structures are disposed.

20. The component according to claim 1, wherein:
said component structures are in said closed hollow space; and
said terminal surfaces are outside said closed hollow space.

21. The component according to claim 1, wherein:
said module substrate defines a cavity different from said frame-shaped closed contact region for receiving component structures of said at least one chip; and
a sealing frame is disposed between said module substrate and said at least one chip and surrounds said cavity on all sides thereof.

22. A method for producing a component according to claim 1, which comprises:
providing a wafer with a plurality of component regions as the module substrate and with installation locations for installing chips thereat;
equipping individual chips in the component regions of the wafer to form a respective closed cavity between the wafer and each of the chips; and
permanently electrically and mechanically connecting the chips with the wafer to thereby isolate the created components that are each associated with one of the component regions.

23. The method according to claim 22, which further comprises:
embodying the installation locations for the chips as recesses in each component region; and
equipping the wafer with the chips to form closed hollow spaces between the wafer and every chip in a region of the recesses.

24. The method according to claim 22, which further comprises forming the mechanical connection of the chips on the wafer by direct wafer bonding.

25. The method according to claim 22, which further comprises:
prior to equipping the wafer with the chips on the frame-shaped closed contact region, placing connection frames at the installation locations and permanently mechanically connecting the connection frames with the wafer; and
placing the chips on the corresponding connection frames and permanently mechanically connecting the chips therewith.

26. The method according to claim 22, which further comprises:
permanently mechanically connecting each of the chips with a respective connection frame;
assembling the chips on the module substrate to locate the connection frames therebetween; and
permanently mechanically connecting the connection frames with the module substrate.

27. The method according to claim 25, which further comprises:
providing the connection frame as an electrically insulating frame and the wafer as a Si-wafer; and
permanently mechanically connecting the Si-wafer and the chips.

28. The method according to claim 25, which further comprises:
providing the frame as a metal frame and the wafer as a Si-wafer; and
effecting the mechanical connection between the Si-wafer and the contact regions of the chips with a process selected from one of the group consisting of thermocompression, soldering, and eutectic bonding.

29. The method according to claim 22, which further comprises providing the chips with a Si-substrate.

30. The method according to claim 22, which further comprises providing the wafer with components hidden inside thereof, the components selected from at least one of the group consisting of integrated electronically passive components, embedded electronically passive components, integrated electronically active components, and embedded electronically active components.

31. The method according to claim 22, which further comprises providing the chip with components hidden inside thereof, the components selected from at least one of the group consisting of integrated electronically passive components and integrated electronically active components.

32. A method for producing a component, which comprises:
providing a wafer with a plurality of component regions as a module substrate, the module substrate having an upper side, an underside, contact surfaces on the upper side, a frame-shaped closed contact region, external contacts on one of the upper side and the underside, and installation locations for installing chips thereat;

equipping individual chips in the component regions of the wafer to form a respective closed cavity between the wafer and each of the chips, each of the chips having:

a chip substrate having a circumferential edge region on the contact region of the module substrate on all sides thereof and completely and permanently mechanically joined therewith;

component structures and terminal surfaces on the chip substrate and facing the module substrate; and the chip substrate being positioned at the module substrate to form a continuous and circumferential permanent joint directly between the frame-shaped closed continuous and circumferential contact region and the circumferential edge region that defines a closed hollow space in which the component structures are disposed between the module substrate and the chip substrate; and permanently electrically and mechanically connecting the chips with the wafer to thereby isolate the created components that are each associated with one of the component regions, wherein:

said module substrate defines a recess on said upper side opposite a region of said component structures;

said closed hollow space is between said chip substrate and said recess of said module substrate;

said circumferential edge region of said chip includes silicon; and said mechanically joined connection between said module substrate and said chip is created by a wafer bonding method.

33. A method for producing a component according to claim 1, which comprises:

providing a wafer with a plurality of component regions as the module substrate and with installation spaces for installing chips thereat;

equipping individual chips in the component regions of the wafer to form a respective closed cavity between the wafer and each of the chips, at least one of the chips having a chip substrates; and permanently electrically and mechanically connecting the chips with the wafer to thereby isolate the created components that are each associated with one of the component regions, at least some electrical connections being disposed in an interior of the chip substrate.

34. A method for producing a component according to claim 4, which comprises:

providing a wafer with a plurality of component regions as the module substrate and with installation locations for installing chips thereat, the module substrate defining the recess;

equipping individual chips in the component regions of the wafer to form a respective closed cavity between the wafer and each of the chips;

sinking at least one of the chips into the recess of the module substrate; and permanently electrically and mechanically connecting the chips with the wafer to thereby isolate the created components that are each associated with one of the component regions.

* * * * *